United States Patent
Jacques et al.

(10) Patent No.: US 7,016,193 B1
(45) Date of Patent: Mar. 21, 2006

(54) HIGH EFFICIENCY COUNTER-FLOW SHELF COOLING SYSTEM

(75) Inventors: Joseph Jacques, Garland, TX (US);
Hiep Nguyen, Grand Prairie, TX (US);
Osvalso Garcia, Carrollton, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/663,252

(22) Filed: Sep. 16, 2003

(51) Int. Cl.
*H05K 7/20* (2006.01)

(52) U.S. Cl. ...................... 361/695; 361/690; 361/694; 165/104.33; 454/184

(58) Field of Classification Search ................ 361/695, 361/687–690, 715–721; 454/184; 174/16.1, 174/252; 165/80.3, 104.33
See application file for complete search history.

(56) References Cited

U.S. PATENT DOCUMENTS

| | | | |
|---|---|---|---|
| 4,502,100 A | | 2/1985 | Greenspan et al. ......... 361/384 |
| 4,644,443 A | * | 2/1987 | Swensen et al. ............ 361/687 |
| 5,424,915 A | * | 6/1995 | Katooka et al. ............ 361/695 |
| 5,544,012 A | | 8/1996 | Koike ........................ 361/695 |
| 5,949,646 A | * | 9/1999 | Lee et al. ................... 361/695 |
| 5,963,425 A | * | 10/1999 | Chrysler et al. ............ 361/695 |
| 6,388,879 B1 | * | 5/2002 | Otaguro et al. ............ 361/695 |
| 6,504,717 B1 | * | 1/2003 | Heard ........................ 361/695 |
| 6,538,881 B1 | * | 3/2003 | Jeakins et al. ............. 361/687 |
| 6,594,148 B1 | * | 7/2003 | Nguyen et al. ............ 361/695 |

FOREIGN PATENT DOCUMENTS

| | | | |
|---|---|---|---|
| EP | 312372 A2 | * | 4/1989 |
| JP | 03094495 A | * | 4/1991 |

* cited by examiner

*Primary Examiner*—Boris Chérvinsky
(74) *Attorney, Agent, or Firm*—Cindy Kaplan

(57) ABSTRACT

Techniques for cooling electronics assemblies are provided. A divider, such as an electronic card, is utilized to define flow channels through the chassis of the electronics assembly. The divider is parallel to the electronic cards and air movers, such as fans, can be utilized in a push-pull configuration to cause air to flow and counter-flow through the flow channels to cool the electronic cards.

10 Claims, 6 Drawing Sheets

HIGH EFFICIENCY COUNTER-FLOW SHELF COOLING SYSTEM

BACKGROUND OF THE INVENTION

The present invention relates to electronic assemblies. More specifically, the invention relates to techniques for providing air flow through electronic assemblies for cooling electronic components therein.

Most modern electronics equipment contains electronic components, such as electronic cards, mounted in a chassis (also referred to as "shelf"). The chassis is generally enclosed, with a front access door, side walls and a backplane. The chassis is enclosed to prevent stray material from entering the casing and damaging the electronic components. Additionally, the chassis prevents stray emission of electromagnetic energy.

The electronic components housed within the chassis often generate heat during operation. If the temperature within the chassis is allowed to raise unchecked, the electronic components may lose their effectiveness or become irreparably damaged. Thus, it is desirable to provide for the cooling of electronic components within the chassis.

Typically, the electronic components are cooled using air that is forced into the chassis and made to flow over the components. Fan trays can be employed to force the air through the chassis. For example, in a conventional push-pull air flow system, a fan tray is positioned at a bottom part of the chassis within an inlet opening while a second fan tray is positioned at the top part of the chassis with an exhaust opening. Thus, air flows through a single flow channel through the chassis to cool the electronic components. Unfortunately, this configuration can require too much valuable space for cooling, which could otherwise be used for electronic components or cable routing.

An innovative air flow system is described in U.S. Pat. No. 6,594,148, which is hereby incorporated by referenced. As described therein, push-pull fans can be utilized to move air through two flow channels within the chassis. A divider mechanism is coupled to each electronic component in order to define the flow channels. Although this air flow system has achieved tremendous success, it would be still beneficial to have additional innovative techniques for air flow systems.

SUMMARY OF THE INVENTION

The present invention provides innovative techniques for cooling electronic components in electronics assemblies, such as for telecommunications. In general, a divider is present within the chassis where the divider is parallel to the electronic cards therein. The divider defines (or separates) two flow channels. Air movers such a fans or blowers can be utilized to cause air to flow through one flow channel in one direction and flow through the second flow channel in a counter-flow direction. Advantages include that the electronic cards can be efficiently cooled and a divider parallel to the electronic cards defines the flow channels. Some specific embodiments of the invention are described below.

In one embodiment, the invention provides an electronic assembly. A chassis defines an internal cavity for receiving a plurality of electronic cards. There is a divider within the chassis, the divider being parallel to the electronic cards and defining first and second flow channels. A first air mover is configured to cause air to flow through the first flow channel. A second air mover is configured to cause air flowing in the first flow channel to flow through the second flow channel. In some embodiments, the divider is an electronic card.

In another embodiment, the invention provides an electronics assembly. A chassis defines an internal cavity for receiving a plurality of electronic cards. There is an electronic card within the chassis defining first and second flow channels. A first air mover is configured to cause air to flow through the first channel. A second air mover is configured to cause air flowing in the first flow channel to flow through the second flow channel. Typically, the first and second air movers are fans or blowers.

In another embodiment, the invention provides a method of providing air through an electronics assembly having a chassis. Air is moved through a first flow channel in the chassis, where the first flow channel is defined by an electronic card within the chassis. Air is moved from the first flow channel to a second flow channel in the chassis, where the second flow channel is defined by the electronic card within the chassis. In some embodiments, the air flowing in the first channel flows in a direction opposite the air flowing in the second flow channel.

Other features and advantages of the invention will become readily apparent upon review of the following description in association with the accompanying drawings, where the same or similar structures are designated with the same reference numerals.

DETAILED DESCRIPTION OF PREFERRED EMBODIMENTS

In the description that follows, the present invention will be described in reference to embodiments in telecommunications equipment assemblies. However, embodiments of the invention are not limited to any particular environment, protocol, application, or implementation. For example, the invention can be advantageously applied to any electronics assembly. Therefore, the description of the embodiments that follows is for purposes of illustration and not limitation.

Figure 1:
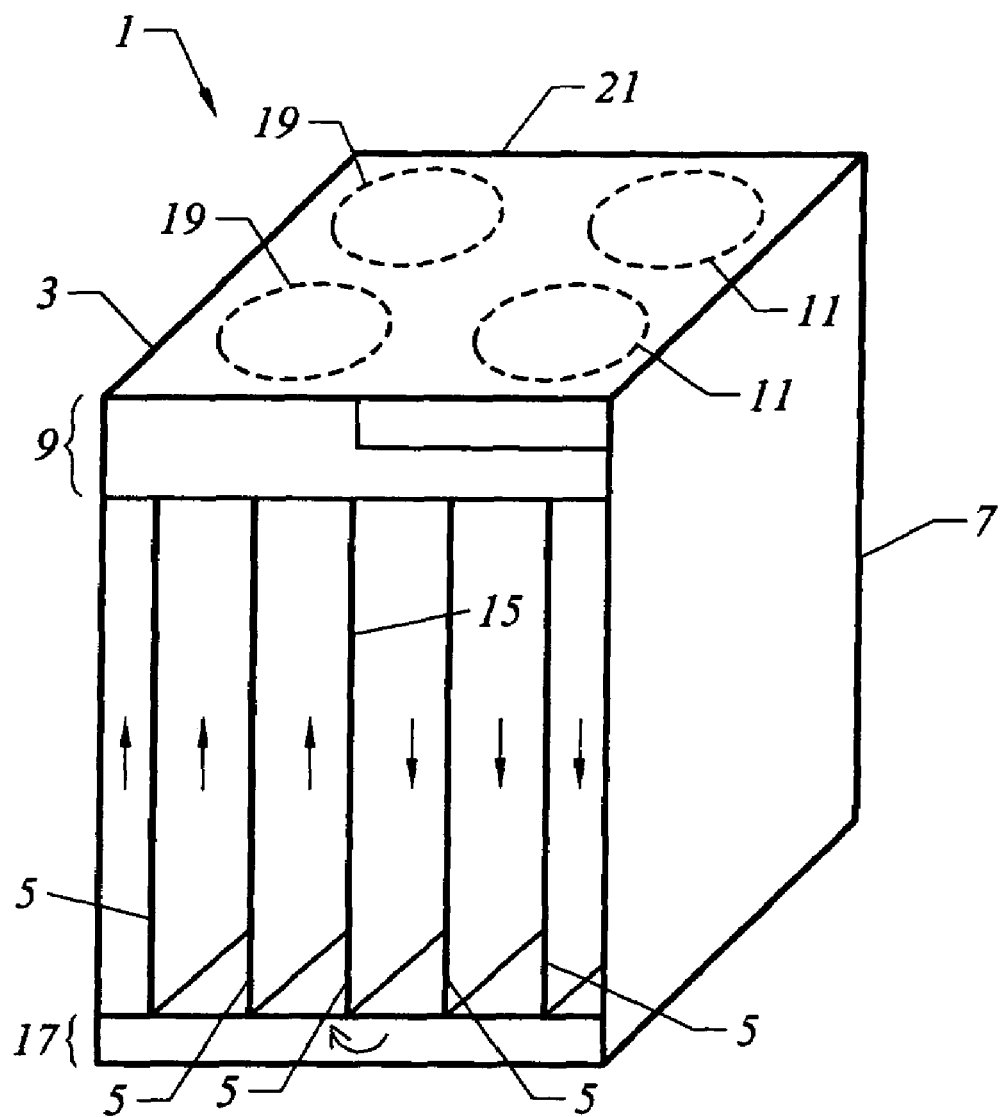
FIG. 1 is a simplified perspective view of an electronics assembly in accordance with an embodiment of the invention.

FIG. 1 shows a perspective view of an electronics assembly, such as for telecommunications. Electronics assembly 1 (also known as "shelf" or "shelf assembly") includes a chassis 3. Chassis 3 typically includes top, bottom, side, and back panels that surround the interior of the chassis.

A front panel (not shown) can be opened to access electronic cards 5, which can be inserted and removed from the interior of chassis 3. Typically, electronics cards 5 communicate through a backbone 7 at the rear of the chassis. Additionally, cable or fiber management can also be accomplished at the rear of the chassis.

For telecommunication applications, electronic cards 5 can be optical line cards, cross-connect cards (CXC), timing and system control cards (TSC), and the like. The electronic cards provide functionality to electronics assembly 1.

A top section 9 of chassis 3 includes air movers to force air through chassis 3 in order to help cool electronic cards 5. Air movers can be fans, blowers or any other electromagnetic device that causes air movement. Although the embodiments described herein include fans, the invention is not limited to any particular air mover and various air movers can be utilized advantageously in other embodiments.

Four fans are shown with dash lines within top area 9. A pair of fans 11 receive air from an inlet opening 13 and force the air downward over the electronic cards on the right side of chassis 3 as shown by the arrows.

An electronic card 15 acts as a divider and defines flow channels on either side of electronic card 15. As shown, electronic card (or divider) 15 is parallel to the other electronic cards. Although the embodiments show the divider (or dividers) is an electronic card, in other embodiments the divider need not be an electric card (e.g., a sheet of metal or plastic).

Pair of fans 11 causes air to flow through a first flow channel in a downward direction. The air changes direction in a plenum 17 and flow into a second flow channel defined by electronic card 15. A pair of fans 19 cause air flowing in the first channel to flow through the second flow channel in an upward direction as shown by the arrows. The air then exits chassis 3 through an exhaust opening 21 on the back of the chassis. As shown, pairs of fans 11 and 19 can be in a fan tray. Although pairs of fans are shown, embodiments can utilize any number of fans.

As can be seen, the embodiment shown in FIG. 1 has air flowing in one direction in one flow channel and counter-flowing in an opposite direction in another flow channel. As the divider (or dividers) are parallel to the electronic cards, embodiments can utilize one or more electronic cards as the dividers that define the flow channels. As such, it is not necessary to attach anything to the electronic cards to define the flow channels.

Figure 2:
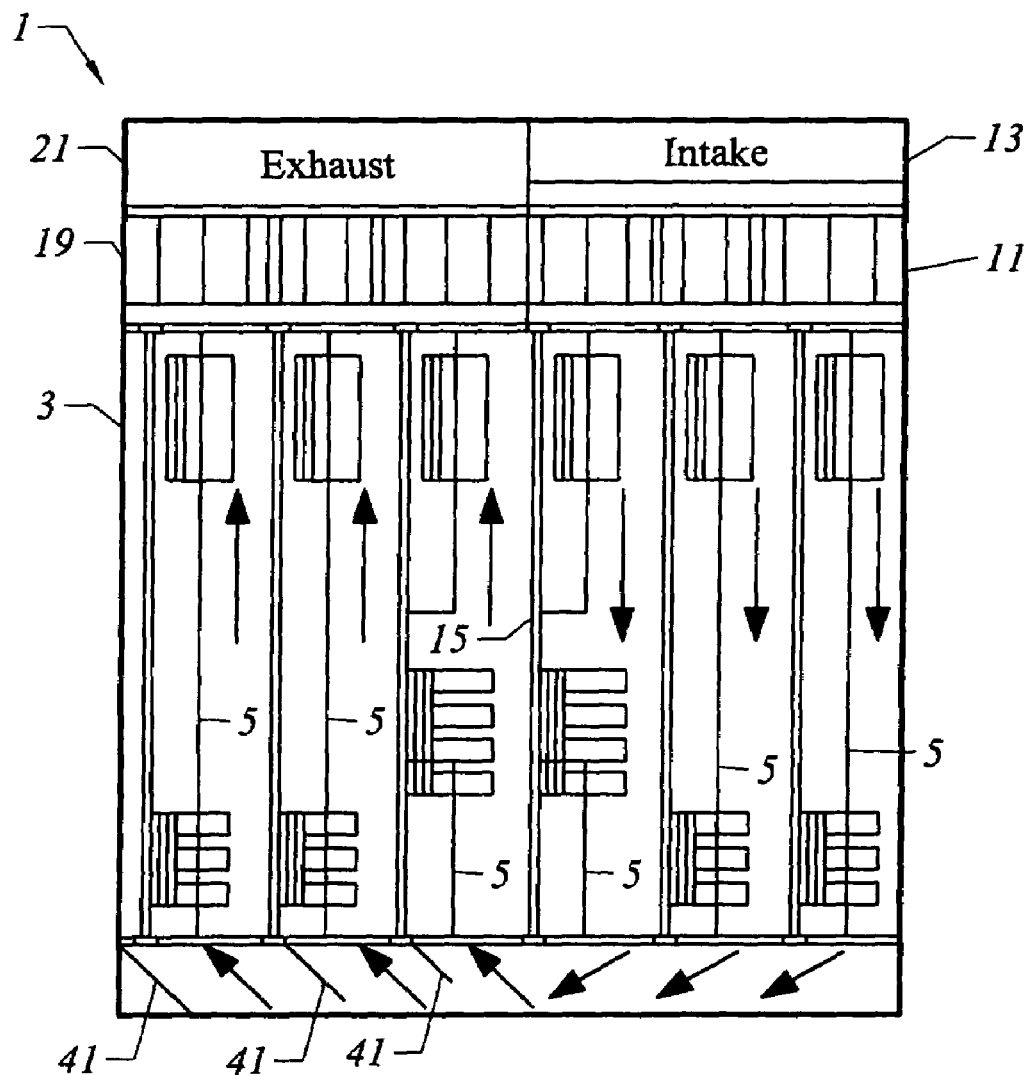
FIG. 2 shows a front view of an electronics assembly including air flow through the chassis.

Now that one view of electronics assembly 1 has been described, it may be beneficial to describe other views. FIG. 2 shows a front view of an electronics assembly. Air enters chassis 3 through intake opening 13 and a pair of fans 11 cause air to flow through the first flow channel in a downward direction over electronic cards 5. As described above, electronic card 15 defines the flow channels.

Air changes direction within plenum 17. One or more flow guides 41 are utilized to assist air flow from the first flow channel to the second flow channel. For example, flow guides 41 can aid in distributing air more evenly over the electronic cards in the second flow channel.

Pair of fans 19 cause air flowing in the first channel to flow through the second flow channel via plenum 17 as shown, the air flows in an upward direction over electronic card 5 in the second flow channel defined by electronic card 15. The air exits chassis 3 through exhaust opening 21.

The directions of air flow such as upwards and downwards are utilized for illustration purposes in reference to the drawings. It should be understood that theses directions are relative and can be varied in other embodiments. Additionally, exhaust opening 21 may be preferably be on a different side of the chassis as will be seen in more detail with reference to FIG. 3.

Figure 3:
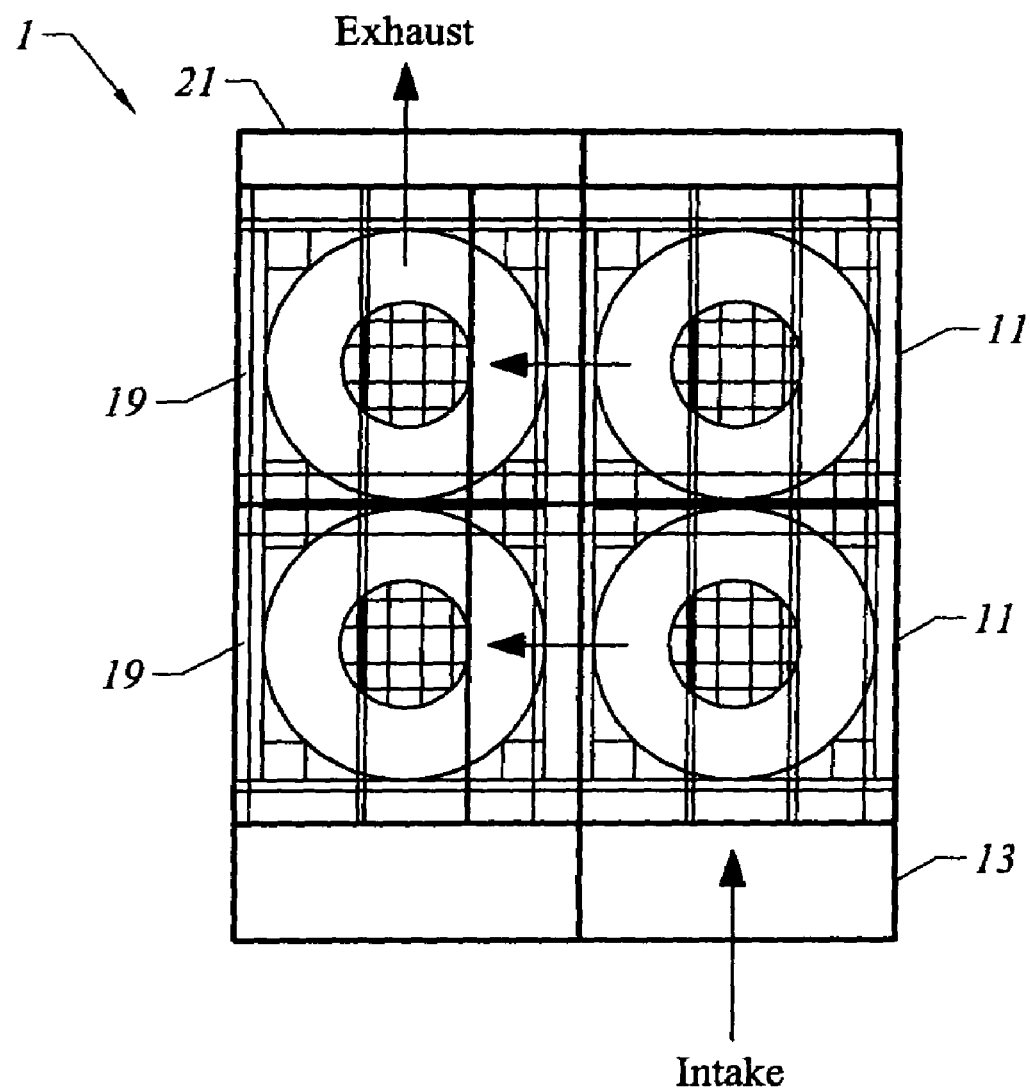
FIG. 3 shows a top view of an electronics assembly including air flow through the chassis.

FIG. 3 shows a top view of an electronics assembly. As shown, air enters inlet opening 13 and pair of fans 11 cause air to flow through the first flow channel the air reverses direction and is caused to flow through the second flow channel by pair of fans 19. The air then exits chassis 3 at exhaust opening 21.

Figure 4C:
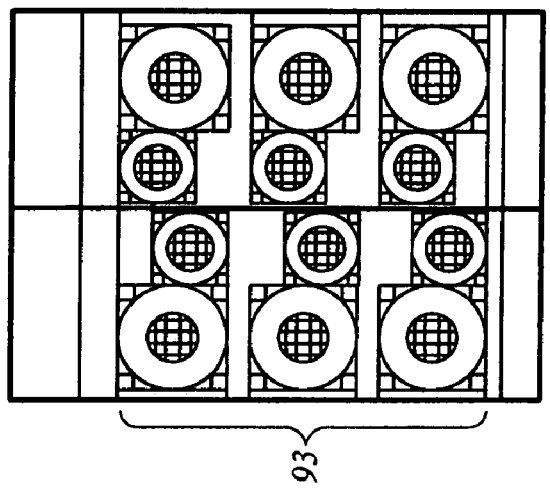
FIGS. 4A–4C show embodiments with a varying number and size of fans.
Figure 4B:
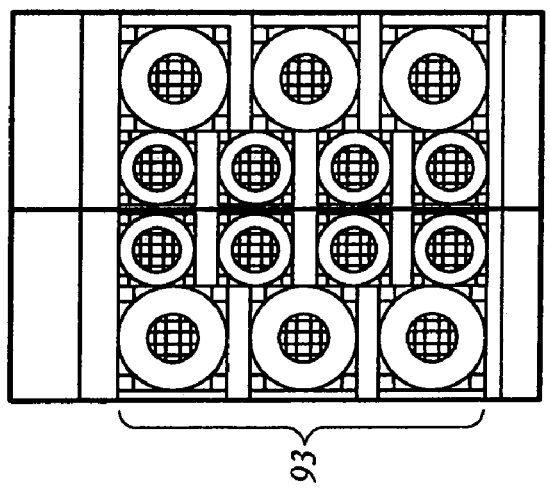
Figure 4A:
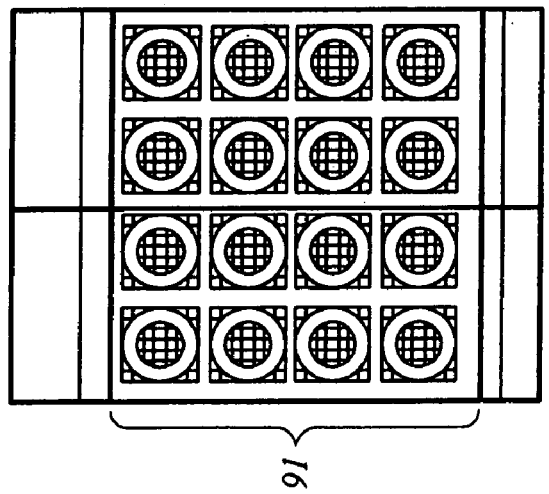
Figure 5:
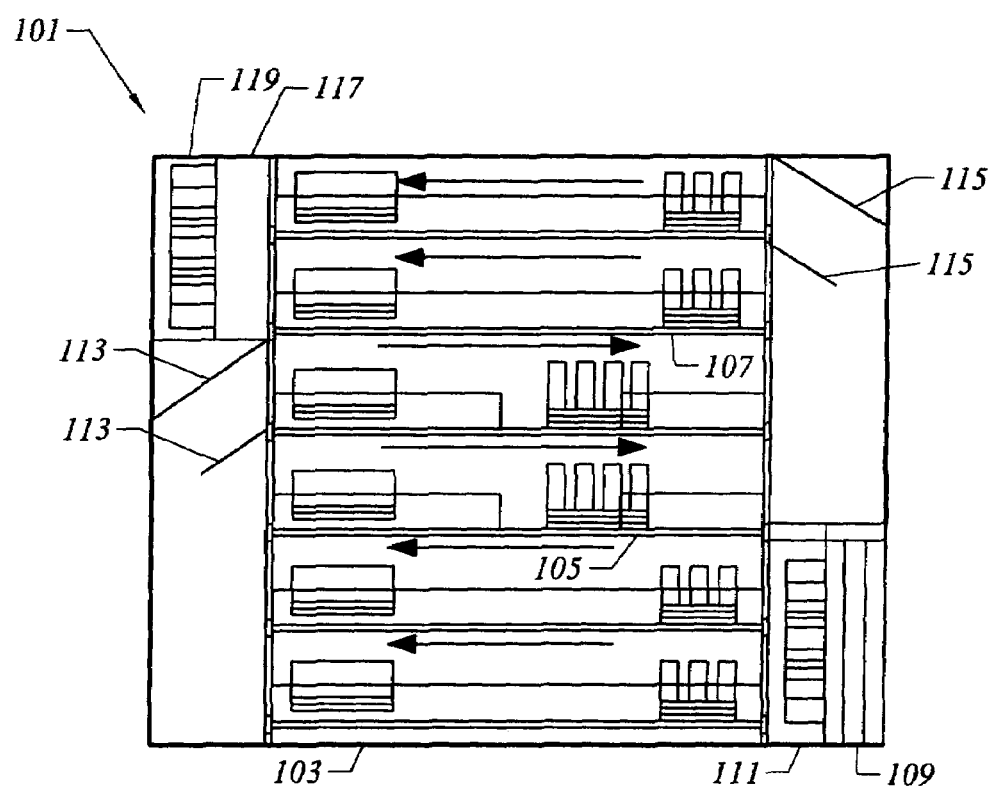
FIG. 5 shows a front view of an embodiment where the electronic cards are horizontal within the chassis.

The above has described pairs of fans that are utilized as the air movers. FIGS. 4A–4C shows fans that can be utilized in other embodiments. FIG. 4A shows that numerous smaller fans 91 can be utilized. FIGS. 4B and 4C show that embodiments can utilize fans 93 of different sizes and numbers. Accordingly, the invention is not limited to the size and/or number of air movers that are utilized. As the air movers can be varied depending on the implementation, the configuration of the chassis can also be varied. FIG. 5 shows an electronic assembly where the electronic cards are horizontal. Electronics assembly 101 includes a chassis 103 that houses electronic cards as shown.

Electronic card 105 defines first and second flow channels. In a similar manner, electronic card 107 defines the second and third flow channels.

Air enters chassis 103 through an inlet opening 109. The air is caused to move through the first flow channel by air mover 111 and flow guides 113 assist the air into the second flow channel.

The air flows through the second flow channel and are assisted to the third flow channel by flow guides 115. Air mover 117 is the pull fan of the push-pull air flow system and therefore assist air through the flow channels. The air exits chassis 113 through exhaust opening 119.

Accordingly, the embodiment shown in FIG. 5 illustrates that the electronic cards can be indifferent orientations. Additionally, the air movers need not be in the same tray (or fan tray). Also, the embodiments illustrates that the air can counter-flow one or more times.

Figure 6:
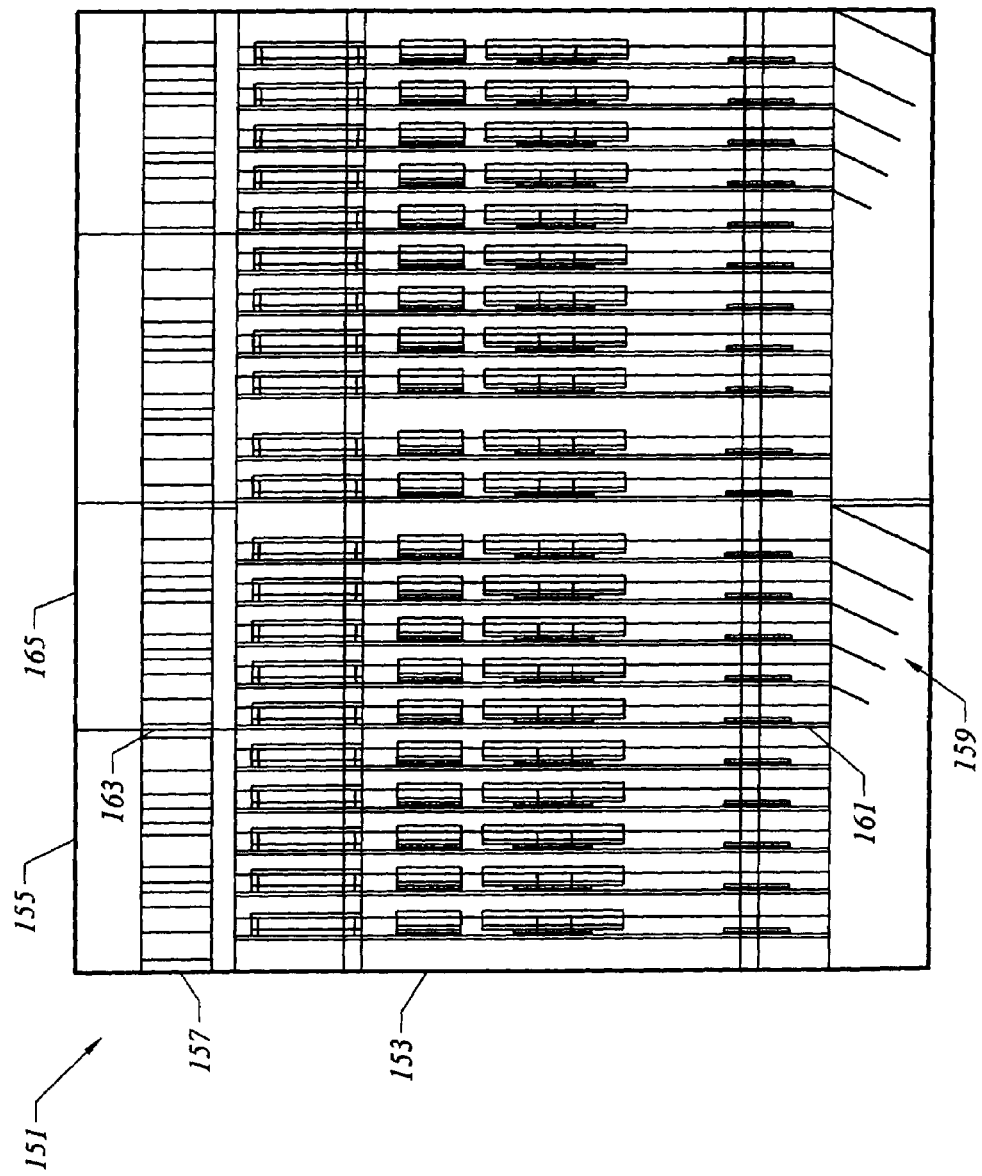
FIG. 6 shows an embodiment of an electronics assembly where there are multiple separate counter-flow channels.

As FIG. 5 illustrated, there can be more than two flow channels through an electronic assembly. FIG. 6 shows an electronic assembly that has four flow channels that are separated into two distinct paths.

Electronics assembly 151 includes multiple electronic cards within chassis 153 as shown. Air enters chassis 153 through an inlet opening 155 and the air is caused to move through a first flow channel by an air mover 157. As before, flow guides 159 assist air from the first flow channel to the second flow channel, where the flow channels are defined by an electronic card 161.

An air mover 163 causes air to flow through the second flow channel and exits through an exhaust opening 165. The air flow system described is duplicated on the other half of chassis 153, thereby creating third and fourth flow channels that define a different and distinct air flow path through chassis 153.

As can be seen, the number of electronic cards in electronics assembly 151 is not symmetric. Accordingly, it is not required that the electronics assembly has a full capacity of cards or that the number of cards be symmetric.

By utilizing fans in a push-pull series, the static pressure for each fan can be reduced, thereby increasing fan efficiency. As shown, embodiments of the invention can efficiently air cool electronic cards within electronics assemblies by utilizing a divider that is parallel to the electronic cards. The divider (or dividers) can also be an electronic card within the electronics assembly.

While the above is a complete description of preferred embodiments of the invention, various alternatives, modifications, and equivalents can be used. It should be evident that the invention is equally applicable by making appropriate modifications to the embodiments described above. For example, although the invention has been described in reference to air movers that are fans, any type of air mover can be utilized. Therefore, the above description should not be taken as limiting the scope of the invention as defined by the metes and bounds of the appended claims along with their full scope of equivalents.

What is claimed is:

1. An electronics assembly, comprising:
 a chassis defining an internal cavity for receiving a plurality of electronic cards;
 a divider within the chassis, the divider being parallel to the electronic cards and defining at least first and second flow channels, wherein the divider is one of said plurality of electronic cards;
 a first air mover configured to cause air to flow through the first flow channel; and
 a second air mover configured to cause air flowing in the first flow channel to flow through the second flow channel.

2. The electronics assembly of claim 1, wherein the first and second air movers are fans or blowers.

3. The electronics assembly of claim 1, further comprising a flow guide to assist air flow from the first flow channel to the second flow channel.

4. The electronics assembly of claim 1, wherein the first and second air movers are in a fan tray.

5. The electronics assembly of claim 1, wherein the first air mover is in a fan tray with one or more additional air movers.

6. The electronics assembly of claim 1, wherein the second air mover is in a fan tray with one or more additional air movers.

7. The electronics assembly of claim 1, wherein the air flowing in the first channel flows in direction opposite the air flowing in the second flow channel.

8. The electronics assembly of claim 1, further comprising an intake opening for air to flow through to the first flow channel.

9. The electronics assembly of claim 1, further comprising an exhaust opening for air to flow through from the second flow channel.

10. An electronics assembly, comprising:
 a chassis defining an internal cavity for receiving a plurality of electronic cards;
 an electronic card means for defining first and second flow channels within the chassis, the means for defining being parallel to the electronic cards and;
 a first means for moving air through the first flow channel; and
 a second means for moving air in the first channel to flow through the second flow channel.

* * * * *